United States Patent
Lee et al.

(10) Patent No.: US 11,704,064 B2
(45) Date of Patent: Jul. 18, 2023

(54) MEMORY CONTROLLER, STORAGE DEVICE AND MEMORY SYSTEM

(71) Applicant: SAMSUNG ELECTRONICS CO., LTD., Suwon-si (KR)

(72) Inventors: Choongeui Lee, Suwon-si (KR); Chulseung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 17/321,919

(22) Filed: May 17, 2021

(65) Prior Publication Data
US 2022/0011978 A1 Jan. 13, 2022

(30) Foreign Application Priority Data
Jul. 9, 2020 (KR) .................... 10-2020-0084938

(51) Int. Cl.
*G11C 7/22* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .... G06F 3/0659; G06F 3/0604; G06F 3/0679; G06F 13/1689; G06F 3/0658;
(Continued)

(56) References Cited

U.S. PATENT DOCUMENTS 5,481,497 A * 1/1996 Yamauchi ............ G11C 7/1048
365/207
6,836,142 B2 12/2004 Lesea et al.
(Continued)

FOREIGN PATENT DOCUMENTS

JP 2020184270 A * 11/2020 ............. G06F 1/182
KR 10-0650370 11/2006

OTHER PUBLICATIONS

Hynix Semiconductor: ONFI Specifications, Mar. 10, 2011, p. 1-288, XP055156981, US Retrieved from the Internet: URL:https://media-www.micron.com/-/media/client/onfi/specs/onfi_3_0_gold.pdf?la=en&rev=80b59d2e8b704c8297d2b38578db62c2.
(Continued)

*Primary Examiner* — Michael T Tran
(74) *Attorney, Agent, or Firm* — F. Chau & Associates, LLC

(57) ABSTRACT

A memory controller configured to control a non-volatile memory device includes: a signal generator configured to generate a plurality of control signals comprising a first signal and a second control signal; a core configured to provide a command for an operation of the non-volatile device; and a controller interface circuit configured to interface with the non-volatile memory device, wherein the controller interface circuit comprises a first transmitter connected to a first signal line and a second signal line; and a first receiver connected to the first signal line, and the first control signal and the second control signal are respectively transmitted to the non-volatile memory device through the first signal line and the second signal line.

20 Claims, 10 Drawing Sheets

(51) Int. Cl.
  *G06F 13/16* (2006.01)
  *G11C 7/10* (2006.01)
(52) U.S. Cl.
  CPC ........ *G06F 13/1689* (2013.01); *G11C 7/1093* (2013.01); *G11C 7/222* (2013.01)
(58) Field of Classification Search
  CPC ..... G06F 13/1673; G11C 5/066; G11C 16/32; G11C 2207/2227; G11C 7/1093; G11C 7/222; G11C 16/06; G11C 7/1066; G11C 16/24
  USPC ............................................ 365/193, 189.03
  See application file for complete search history.

(56) References Cited

U.S. PATENT DOCUMENTS

| | | | | |
|---|---|---|---|---|
| 7,412,053 | B1 * | 8/2008 | Lyle | H04L 9/0844 |
| | | | | 714/724 |
| 7,450,437 | B2 | 11/2008 | Choi | |
| 7,487,378 | B2 | 2/2009 | Morein et al. | |
| 8,494,084 | B1 * | 7/2013 | Nabar | H04B 7/043 |
| | | | | 375/299 |
| 9,640,244 | B1 * | 5/2017 | Jeter | G06F 13/1694 |
| 9,658,642 | B2 | 5/2017 | Mozak | |
| 9,965,408 | B2 | 5/2018 | Gans et al. | |
| 10,491,544 | B2 | 11/2019 | Koide et al. | |
| 10,734,983 | B1 * | 8/2020 | Jeter | G11C 11/409 |
| 11,054,855 | B2 * | 7/2021 | Cho | G06F 1/10 |
| 11,217,285 | B1 * | 1/2022 | Jeter | G06F 13/1689 |
| 11,245,869 | B2 * | 2/2022 | Toba | H03L 7/18 |
| 2009/0052261 | A1 | 2/2009 | Koo et al. | |
| 2009/0154285 | A1 * | 6/2009 | Pyeon | G11C 7/20 |
| | | | | 365/233.1 |
| 2009/0207895 | A1 * | 8/2009 | Park | G11C 7/1093 |
| | | | | 375/219 |
| 2010/0026469 | A1 * | 2/2010 | Shiotsu | G06K 19/0723 |
| | | | | 340/10.51 |
| 2013/0249612 | A1 * | 9/2013 | Zerbe | G11C 7/222 |
| | | | | 327/161 |
| 2014/0016404 | A1 * | 1/2014 | Kim | G11C 11/165 |
| | | | | 365/158 |
| 2014/0019792 | A1 * | 1/2014 | Oh | G11C 7/1093 |
| | | | | 713/501 |
| 2017/0013294 | A1 * | 1/2017 | Velasco | H04N 21/4367 |
| 2019/0064909 | A1 * | 2/2019 | Bito | G06F 1/325 |
| 2019/0187929 | A1 * | 6/2019 | Srivastava | G06F 3/0679 |
| 2019/0198068 | A1 * | 6/2019 | Sreeramaneni | G11C 7/1078 |
| 2019/0221240 | A1 * | 7/2019 | Jeon | G06F 3/0604 |
| 2019/0393633 | A1 * | 12/2019 | Saito | H01R 12/725 |
| 2022/0011978 | A1 * | 1/2022 | Lee | G06F 3/0604 |
| 2022/0293154 | A1 * | 9/2022 | Jang | G11C 7/1093 |

OTHER PUBLICATIONS

ESSR dated Dec. 14, 2021 in corresponding EP Patent Application No. 21182934.6.

* cited by examiner

US 11,704,064 B2

MEMORY CONTROLLER, STORAGE DEVICE AND MEMORY SYSTEM

CROSS-REFERENCE TO RELATED APPLICATION

This application claims priority under 35 U.S.C. § 119 to Korean Patent Application No. 10-2020-0084938, filed on Jul. 9, 2020, in the Korean Intellectual Property Office, the disclosure of which is incorporated by reference herein in its entirety.

FIELD

The inventive concept generally relates to memory controllers, and more particularly relates to a memory controller, a storage device including the memory controller, and a corresponding memory system.

DISCUSSION OF RELATED ART

Along with the development of storage systems including non-volatile devices such as solid-state drives (SSD), data input/output (I/O) rates between a non-volatile device and a controller in the storage system has increased. An impedance-matching method together with Complementary Metal-Oxide Semiconductor (CMOS) technology have been applied to address reflection and ringing on a high-speed signal transmission line. CMOS integrated circuits may be connected to one another by voltage signal transmissions from one area to other areas. An area may include a CMOS amplifier or an inverter, and another area may include a CMOS amplifier, a differential amplifier, or a comparator.

Two interconnection types that are not influenced by a voltage signal are applied. The first type is a differential interconnection, and the second type is a single-sided/single-ended interconnection. The differential interconnection method may reduce common mode noise. A differential amplifier according to single-sided/single-ended pseudo differential interconnection methods may exclude power voltage noise by comparing an input voltage with a reference voltage that are delivered through a single transmission line.

SUMMARY

According to an embodiment, a memory controller is configured for communicating with a memory device regardless of an input/output interface type of a terminal, a storage device including the memory controller, and a memory system.

A memory controller embodiment is configured to control a non-volatile memory device and includes: a signal generator configured to generate a plurality of control signals including a first signal and a second control signal; a core configured to issue a command for an operation of the non-volatile memory device; and a controller interface circuit configured to interface with the non-volatile memory device, wherein the controller interface circuit includes a first transmitter connected to a first signal line and a second signal line and a first receiver connected to the first signal line, and the first control signal and the second control signal are respectively transmitted to the non-volatile memory device through the first signal line and the second signal line.

A storage device embodiment includes: a non-volatile memory device; and a memory controller configured to control the non-volatile memory device by providing a command, an address, data, and a control signal, wherein the memory controller includes a controller interface circuit including a first transmitter configured to apply a differential interconnection method, a first receiver configured to apply a single-ended interconnection method, and a controller interface circuit configured to interface with the non-volatile memory device, and the non-volatile memory device includes a memory interface circuit including a second transmitter and a second receiver configured to interface with the memory controller.

A memory system embodiment includes: a first interface circuit including a first transmitter connected to a first signal line and a second signal line and a first receiver connected to the first signal line; a second interface circuit including a second receiver connected to at least one of the first signal line and the second signal line and a second transmitter connected to at least one of the first signal line and the second signal line, wherein a first control signal and a second control signal are respectively transmitted to the second interface circuit through the first signal line and the second signal line, and the first receiver receives a third control signal for data synchronization after the first control signal is transmitted through the first signal line.

BRIEF DESCRIPTION OF THE DRAWINGS

Embodiments of the inventive concept will be more clearly understood from the following detailed description taken in conjunction with the accompanying drawings, in which.

DETAILED DESCRIPTION

Hereinafter, embodiments of the inventive concept will be described in detail with reference to the accompanying drawings. Like reference indicia may be used with respect to like elements.

Figure 1:
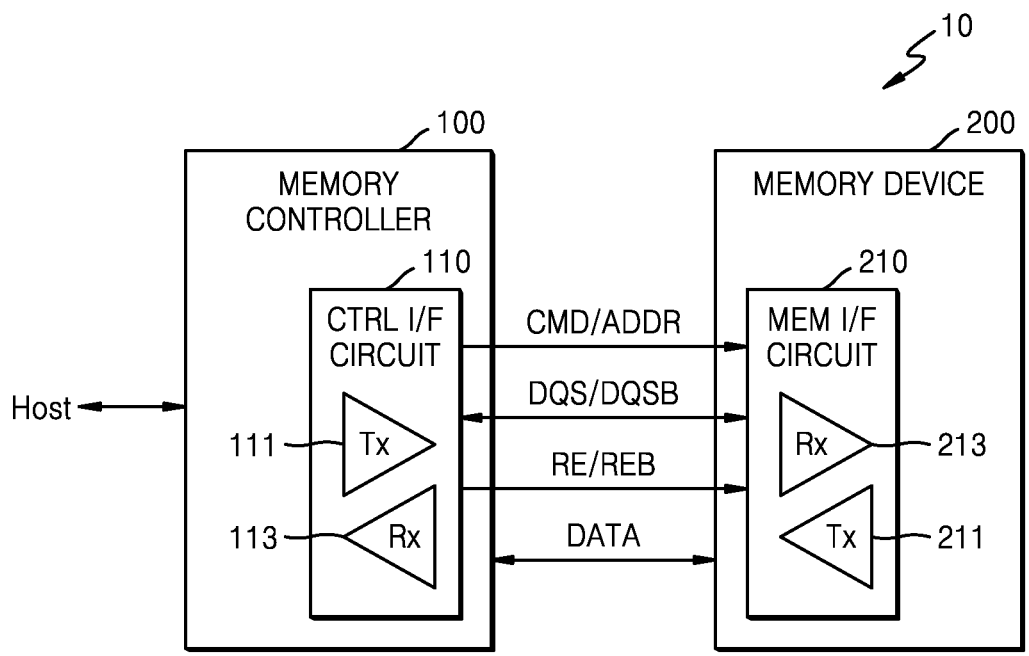
FIG. 1 is a block diagram of a storage device according to an embodiment of the inventive concept.

FIG. 1 is a block diagram of a storage device 10 according to an embodiment of the inventive concept. Referring to FIG. 1, the storage device 10 may include a memory controller 100 and a memory device 200.

The storage device 10 may be non-volatile to store data without a continuous power supply. For example, the storage device 10 may be a Solid-State Drive (SSD), an embedded Universal Flash Storage (UFS) memory device, or an embedded Multi-Media Card (eMMC). In some embodiments, the storage device 10 may be an external memory that may be attached to/detached from an electronic device.

For example, the storage device 10 may include a UFS memory card, Compact Flash (CF), Secure Digital (SD), Micro-Secure Digital (Micro-SD), Mini Secure Digital (Mini-SD), eXtreme Digital (xD), or a memory stick. However, the storage device 10 is not limited thereto and may be embodied in various media employed to store the data.

The storage device 10 and a host may form a storage system, and the storage system may be embodied, for example, in a personal computer (PC), a data server, a network-attached storage (NAS) device, an Internet of Things (IoT) apparatus, or a portable electronic device. The portable electronic device may include a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, and the like.

The memory controller 100 may generally control the storage device 10. The memory controller 100 may control the memory device 200 to read data stored in the memory device 200 or program data on the memory device 200 in response to a read response or a write response from the host. In an embodiment, the memory controller 100 may control program, read, and erase operations with respect to the memory device 200 by providing an address ADDR, a command CMD, and a control signal to the memory device 200. According to an embodiment, control signals may include a data strobe signal DQS, an inverse data strobe signal DQSB, a read enable signal RE, and an inverse read enable signal REB; and may further include various signals for controlling the memory device 200, such as, for example, a write enable signal WE, an inverse write enable signal WEB, a clock signal CLK, a command latch enable signal CLE, an address latch enable signal ALE, and the like.

In addition, signals for programming the data in response to request of a host HOST on the memory device 200, and read data, may be transmitted and received between the memory controller 100 and the memory device 200.

The memory controller 100 may include a controller interface circuit (CTRL I/F CIRCUIT) 110. The CTRL I/F CIRCUIT 110 may perform interfacing to transmit, to the memory device 200, a command CMD issued from the memory controller 100, data DATA exchanged between the memory controller 100 and the memory device 200, an address ADDR which is an address in which the data DATA is stored, and various control signals (for example, the data strobe signal DQS, the inverse data strobe signal DQSB, the read enable signal RE, the inverse read enable signal REB, and the like) controlling the memory device 200 based on the command CMD and the address ADDR.

The CTRL I/F CIRCUIT 110 may follow protocols of the Open NAND Flash Interface working group (ONFI) which provides an open standard for flash memory devices and communication devices. Accordingly, the CTRL I/F CIRCUIT 110 may be interfaced with memory devices of various manufacturers manufactured according to the ONFI protocols. An impedance matching method may be applied to the CTRL I/F CIRCUIT 110 to prevent reflection and ringing on the high-speed signal transmission line.

The CTRL I/F CIRCUIT 110 may include a transmitter 111 and a receiver 113. The transmitter 111 may provide the command CMD, the address ADDR, the data DATA, and the control signals to the memory device 200, and the receiver 113 may receive the data DA, the data strobe signal DQS, the inverse data strobe signal DQBS, and the control signals (for example, the read enable signal RE, the inverse read enable signal REB, and the like) provided from the memory device 200.

According to an embodiment of the inventive concept, each of the transmitter (Tx) 111 and the receiver (Rx) 113 may be configured to adopt a differential interconnection method and/or a single-sided/single-ended interconnection method. These methods are interconnection methods that are not substantially influenced by voltage signals.

According to an example of the inventive concept, the transmitter 111 may be configured with a fully differential interconnection method. Two transmission lines and two input/output pins are used for the fully differential interconnection method. According to the fully differential interconnection method, a transmitting terminal may transmit a signal and a phase inversion signal thereof through two transmission lines, and a receiving terminal may obtain a difference value of the signal and the phase inversion signal thereof provided through the two transmission lines; and by doing so, common mode noise may be removed.

In an embodiment, the transmitter 111 (e.g., a transmitting terminal) may provide the data strobe signal DQS and inverse data strobe signal DQSB to the receiver 213 (e.g., a receiving terminal) of the memory device 200.

According to an embodiment of the inventive concept, the receiver 113 may be configured in the single-ended interconnection method. One transmission line and one input/output pin are required for the single-ended interconnection method. According to the single-ended interconnection method, the transmitting terminal and the receiving terminal may exchange signals through one transmission line. The single-ended interconnection method may exclude a power voltage noise by comparison between an input voltage and a reference voltage delivered through one transmission line.

In an embodiment, the receiver 113 (that is, the receiving terminal) may receive any one of the data strobe signal DQS or the inverse data strobe signal DQSB from the transmitter 211 (e.g., a transmitter terminal) of the memory device 200.

According to an embodiment of the inventive concept, transmission modes of the transmitter 111 and receiver 113 included in the CTRL I/F CIRCUIT 110 may be different from each other. For example, a differential mode of the transmitter 111 may be the fully differential interconnection method, and a differential mode of the receiver 113 may be the single-ended interconnection method. As the transmission modes of the transmitter 111 and receiver 113 are differently configured, the CTRL I/F CIRCUIT 110 may communicate with the memory device 200 regardless of an interface method thereof. Further details regarding interconnection between the differential modes of the memory controller 100 and the memory device 200 may be described further below.

The memory device 200 may include a non-volatile memory device. In an embodiment, the memory device 200 may be a device configured with various kinds of memories, such as, for example, NAND-type Flash Memory, Magnetic RAM (MRAM), Spin-Transfer Torque MRAM (STT-MRAM), Conductive bridging RAM (CBRAM), Ferroelectric RAM (FeRAM), Phase RAM (PRAM), Resistive RAM (ReRAM), Nanotube RAM (Nano-RAM), Polymer RAM (PoRAM), Nano Floating Gate memory (NFGM), holographic memory, Molecular Electronics Memory, Insulator Resistance Change memory, and the like.

In an embodiment, the memory device 200 may include a flash memory, and the flash memory may include a two-dimensional (2D) NAND memory array or a three-dimensional (3D) or vertical NAND (VNAND) memory array. As arrays of memory cells having active regions, and arranged on a silicon substrate or a circuit related to operations of the memory cells, the 3D memory array may be formed in a monolithic manner on the substrate, or at least one physical level of a circuit may be formed in the substrate. The term "monolithic" indicates that layers in each level included in the array are stacked on layers of each lower level in the array. In an embodiment, the 3D memory array may include Vertical NAND strings that are arranged in a vertical direction such that at least one memory cell is above another memory cell. The at least one memory cell may include a charge trap layer.

U.S. Pat. Nos. 7,679,133, 8,533,466, 8,654,587, and 8,559,235 and U.S. Patent Application Publication No. 2011/0233648 describe details, without limitation thereto, of suitable configurations for 3D memory arrays configured in a plurality of levels, such as 3D memory in which word lines and/or bit lines are shared between the plurality of levels, the disclosures of which are incorporated by reference herein in their entireties.

The memory device 200 may include a single-level cell (SLC) configured to store 1-bit data or a multi-level cell (MLC) configured to store multi-bit data (for example, 2 bits or a greater number of bits) per cell. For example, the memory device 200 may include a triple-level cell (TLC) capable of storing 3-bit data, a quadruple-level cell (QLC) capable of storing 4-bit data, or a memory cell capable of storing 5-bit data or a greater number of bits of data per cell.

For convenience of explanation, the memory device 200 is shown as a non-volatile memory device, but the inventive concept is not limited thereto. In other words, it will be understood that the memory device 200 may be implemented as a volatile memory. For example, the memory device 200 may be implemented as Synchronous DRAM (SDRAM), Double Data Rate SDRAM (DDR SDRAM), Low Power Double Data Rate SDRAM (LPDDR SDRAM), Graphics Double Data Rate SDRAM, DDR2 SDRAM, a DDR3 SDRAM, DDR4 SDRAM, and the like. In this case, the memory controller 100 may generate a control signal (for example, the data strobe signal DQS) for controlling the volatile memory device, and the memory device 200 may perform a memory operation in response to the control signal. For example, the memory device 200 may write or read data in synchronization with the data strobe signal DQS.

The memory device 200 may include a memory interface circuit (MEM I/F CIRCUIT) 210. The MEM I/F CIRCUIT 210 may include a receiver 213 and a transmitter 211. The MEM I/F CIRCUIT 210 may be designed to match the ONFI protocols. The MEM I/F CIRCUIT 210 is similar to the CTRL I/F CIRCUIT 110 in that the MEM I/F CIRCUIT 210 both are compatible interfacing devices, and therefore redundant description may be omitted.

The receiver 213 may be provided with a signal that is transmitted by the transmitter 111 of the memory controller 100. In an embodiment, the receiver 213 may use any one of two signals transmitted through two transmission lines. For example, the receiver 213 may receive at least one of the data strobe signal DQS and inverse data strobe signal DQSB transmitted from the transmitter 111.

In an embodiment of the inventive concept, when the receiver 213 uses both of the data strobe signal DQS and the inverse data strobe signal DQSB, the receiver 213 may be configured in the fully differential interconnection method. On the other hand, when the receiver 213 uses any one of the data strobe signal DQS or the inverse data strobe signal DQSB, the receiver 213 may be configured in the single-ended interconnection method.

The transmitter 211 may provide signals according to memory operations to the receiver 113 of the memory controller 100. In an embodiment, the transmitter 211 may use at least one of the two transmission lines. For example, the transmitter 211 may provide at least one of the data strobe signal DQS and the inverse data strobe signal DQSB to the receiver 113.

In an embodiment of the inventive concept, the receiver 213 and the transmitter 211 may have a same interface type. For example, the receiver 213 and the transmitter 211 may be configured with the fully differential interconnection method. Alternatively, the receiver 213 and the transmitter 211 may be configured with the single-ended interconnection method.

According to an embodiment, the read enable signal RE or the inverse read enable signal REB may be transmitted and received through another transmission line between the memory controller 100 and the memory device 200. The read enable signal RE has a characteristic of being transmitted in one direction (that is, from the memory controller 100 towards the memory device 200) due to characteristics for reading data. According to an example of the inventive concept, another transmitter included in the CTRL I/F CIRCUIT 110 may be configured in the fully differential interconnection method, and another receiver included in the MEM I/F CIRCUIT 210 may be configured in any of the fully differential interconnection method or the single-ended interconnection method. The transmission method of the read enable signal RE will be described below in greater detail.

Figure 2:
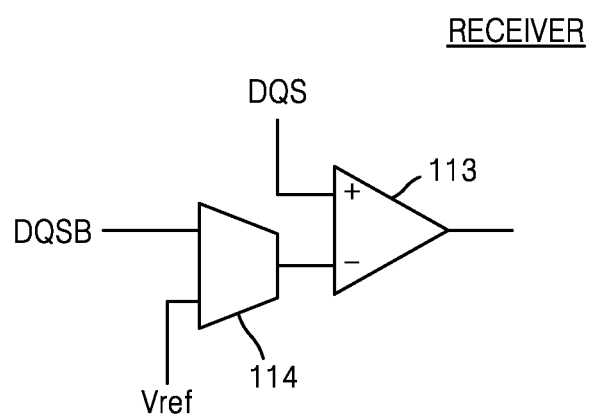
FIG. 2 is a circuit diagram of a receiver according to an embodiment of the inventive concept.

FIG. 2 is a circuit diagram of a receiver according to an embodiment of the inventive concept. FIG. 1 is further referenced in conjunction with FIG. 2. Referring to FIG. 2, the receiver may include the receiver 113 and a multiplexer 114. The receiver may be configured with the single-ended interconnection method.

Any one of the control signals may be applied to the receiver 113. And an inverse signal of the control signal and the reference voltage signal Vref may be applied to the multiplexer 114.

According to an embodiment, the data strobe signal DQS may be applied to the receiver 113, and the inverse data strobe signal DQSB and the reference voltage signal Vref may be applied to the multiplexer 114.

The multiplexer 114 may multiplex the inverse data strobe signal DQSB and the reference voltage signal Vref and select any one of these. According to an embodiment of the inventive concept, when the MEM I/F CIRCUIT 210 is configured with the full-differential interconnection method, the multiplexer 114 may select the inverse data strobe signal DQSB and provide the inverse data strobe signal DQSB to the receiver 113. In this case, the receiver 113 may be provided with one signal. Similarly, when the MEM I/F CIRCUIT 210 is configured in the single-ended interconnection method, the multiplexer 114 may select the reference voltage signal Vref and provide the reference voltage signal Vref to the receiver 113.

The receiver 113 may output a difference between the data strobe signal DQS and the inverse data strobe signal DQSB in response to the MEM I/F CIRCUIT 210 being configured in the fully differential interconnection method. Based on a value of the difference, a common mode noise may be removed, or the control signal may be recognized. Similarly, the receiver 113 may output a difference between the data strobe signal DQS and the reference voltage signal Vref in response to the MEM I/F CIRCUIT 210 being configured with the single-ended interconnection method. The output of the transmitter 113 may be "0" or "1", for example.

For convenience of explanation, it is shown that the data strobe signal DQS is directly connected to the receiver 113 and the inverse data strobe signal DQSB is directly connected to the multiplexer 114. However, embodiments are not limited thereto, and the inverse data strobe signal DQSB may be directly connected to the receiver 113, and the data strobe signal DQS may be directly connected to the multiplexer 114.

According to an embodiment of the inventive concept, as the multiplexer 114 receives both the inverse data strobe signal DQSB and the reference voltage signal Vref but selects one of these and provides the selected signal to the receiver 113, the receiver 113 may process both a signal according to the fully differential interconnection method and a signal according to the single-ended interconnection method. That is, as the multiplexer 114 selectively provides signals, communication between CTRL I/F CIRCUITS 110a and 110b and MEM I/F CIRCUITS 210a and 210b of FIGS. 3A and 3B may be smoothly maintained regardless of the interface type of the MEM I/F CIRCUIT 210.

Figure 3A:
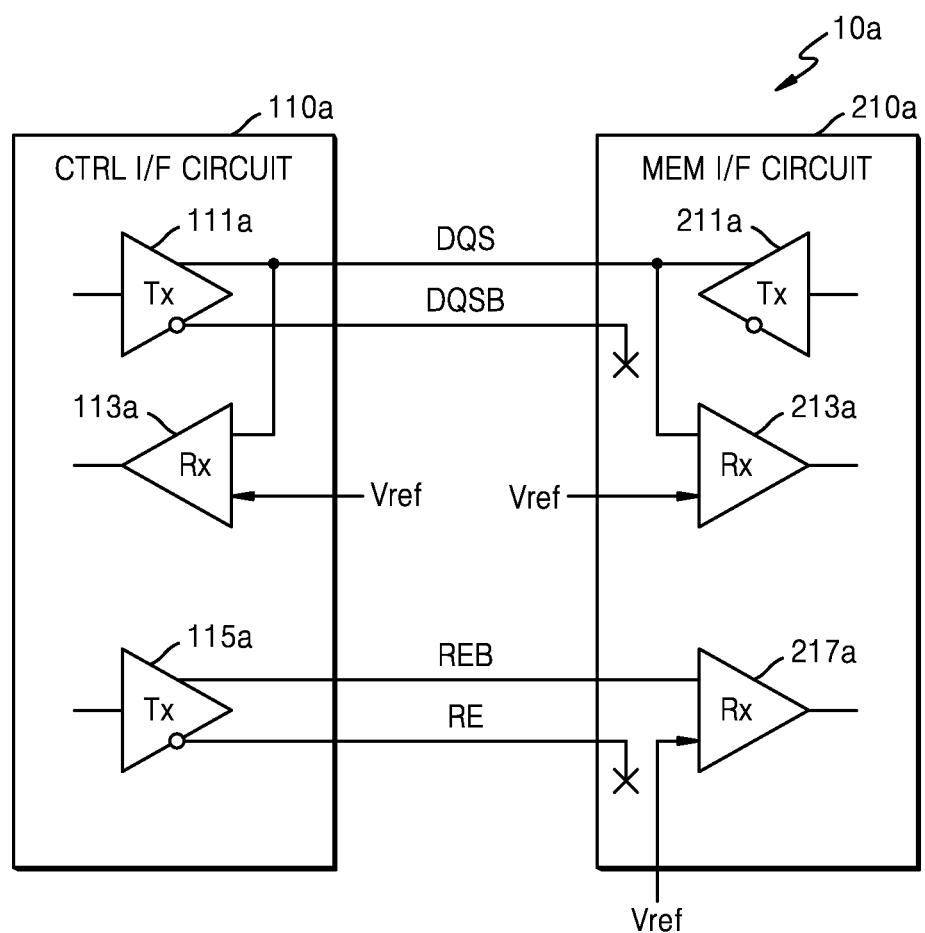
FIGS. 3A and 3B are circuit diagrams showing connection relationships between a controller interface circuit and a memory interface circuit, according to embodiments of the inventive concept.
Figure 3B:
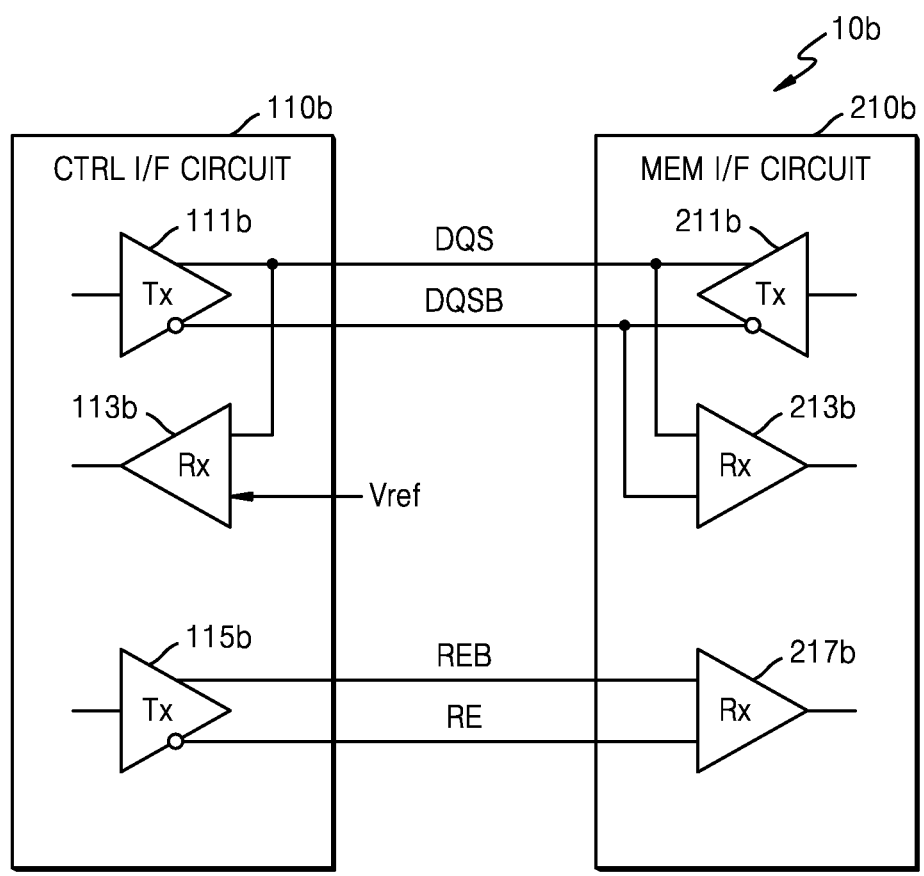

FIGS. 3A and 3B are circuit diagrams of connection relationships between CTRL I/F CIRCUIT 110a and 110b and MEM I/F CIRCUIT 210a and 210b according to embodiments of the inventive concept.

FIG. 3A shows an embodiment in which the MEM I/F CIRCUIT is constructed in a single-ended interconnection type. Referring to FIG. 3A, the CTRL I/F CIRCUIT 110a may include a first transmitter 111a, a first receiver 113a, and a third transmitter 115a. The MEM I/F CIRCUIT 210a may include a second transmitter 211a, a second receiver 213a, and a third receiver 217a.

According to an embodiment, the first transmitter 111a and the first receiver 113a may be respectively connected to the second receiver 213a and the second transmitter 211a through one transmission line. For example, the first transmitter 111a may provide a data strobe signal DQS to the second receiver 213a through a first transmission line, and the second transmitter 211a may provide a data strobe signal DQS to the first receiver 113a by using the first transmission line. Although the first transmitter 111a may provide the inverse data strobe signal DQSB through a second transmission line, the MEM I/F CIRCUIT 210a is configured in the single-ended interconnection method in which one signal is used, and therefore, the second receiver 213a need not be connected to the second transmission line. That is, the second transmission line may be open. Accordingly, the second transmitter 211a need not provide the inverse data strobe signal DQSB to the first receiver 113a along the second transmission line. The first receiver 113a may receive the reference voltage signal Vref.

Consequently, compared to where the first receiver 111a is configured with the fully differential interconnection method, the first receiver 113a may be configured with the single-ended interconnection method. In an alternate embodiment, another or a partial transmission line may be connected between the second transmitter 211a and a neutral or ground plane of the CTRL I/F CIRCUIT 110a.

According to an embodiment, the reference voltage signal Vref may be provided to the first receiver 113a and the second receiver 213a. The reference voltage signal Vref may be used as a reference for comparing magnitudes of control signals (for example, the data strobe signal DQS) input to the first receiver 113a or the second receiver 213a. The reference voltage signal Vref may be generated and provided by an external power source to secure uniformity between operations of the CTRL I/F CIRCUIT 110a and the MEM I/F CIRCUIT 210a. However, the reference voltage signal Vref is not limited thereto and may be generated in each of the CTRL I/F CIRCUIT 110a and/or the MEM I/F CIRCUIT 210a and provided accordingly.

Consequently, the CTRL I/F CIRCUIT 110a may have an asymmetric structure. For example, the CTRL I/F CIRCUIT 110a may have an asymmetric structure in which the first transmitter 111a and the first receiver 113a have different interface types.

According to an embodiment, the third transmitter 115a may transmit a control signal to the third receiver 217a through two transmission lines. For example, the third transmitter 115a may provide the inverse read enable signal REB to the third receiver 217a through a third transmission line. Similarly, the third transmitter 115a may provide the read enable signal RE to the third receiver 217a through a fourth transmission line. However, where the MEM I/F CIRCUIT is configured in the single-ended interconnection method in which one signal is used, the third receiver 217a need not be connected to the fourth transmission line (that is, the fourth transmission line may be open).

According to an embodiment, the third receiver 217a may be provided with the reference voltage signal Vref from the outside. Similar to an embodiment of the above-written description, the reference voltage signal Vref may be directly generated in the MEM I/F CIRCUIT 210a.

FIG. 3B shows an embodiment in which the MEM I/F CIRCUIT is configured with the fully differential interconnection method. Referring to FIG. 3B, the CTRL I/F CIRCUIT 110b may include a first transmitter 111b, a first receiver 113b, and a third transmitter 115b. The MEM I/F CIRCUIT 210b may include a second transmitter 211b, a second receiver 213b, and a third receiver 217b.

According to an embodiment, the first transmitter 111b and the first receiver 113b may be respectively connected to the second receiver 213b and the second transmitter 211b through two transmission lines. For example, the first transmitter 111b may provide the data strobe signal DQS to the second receiver 213b through the first transmission line, and the second transmitter 211b may provide the data strobe signal DQS to the first receiver 113b through the first transmission line. Similarly, the first transmitter 111b may provide the inverse data strobe signal DQSB through the second transmission line. Unlike in FIG. 2A, FIG. 2B shows the MEM I/F CIRCUIT 210b configured in the fully differential interconnection type in which two signals are used, and therefore, the second receiver 213b may be provided with the inverse data strobe signal DQSB through the second transmission line.

According to an embodiment of the inventive concept, compared to where the first transmitter 111b is configured in the fully differential interconnection method, the first receiver 113b, which may be configured with the single-ended interconnection type, need not be provided with the inverse data strobe signal DQSB through the second transmission line.

According to an embodiment, the reference voltage signal Vref may be provided to the first receiver 113b. As described above, the reference voltage signal Vref may be used as the reference for comparing magnitudes of the control signals (for example, the data strobe signal DQS) input to the first receiver 113b, and may be generated and provided by the external power source, or may be generated in the CTRL I/F CIRCUIT 110b and provided internally.

Consequently, the CTRL I/F CIRCUIT 110*b* may have an asymmetric structure in which the first transmitter 111*b* and the first receiver 113*b* have different interface types.

According to an embodiment, the third transmitter 115*b* may transmit a control signal to the third receiver 217*b* through two transmission lines. For example, the third transmitter 115*b* may provide the inverse read enable signal REB to the third receiver 217*b* through the third transmission line. Similarly, the third transmitter 115*b* may provide the read enable signal RE to the third receiver 217*b* through the fourth transmission line. Where the MEM I/F CIRCUIT 210*b* is configured in the fully differential interconnection type in which two signals are used, the third receiver 217*b* may be provided with the read enable signal RE through the fourth transmission line.

According to an embodiment of the inventive concept, compared to a symmetric structure in which the first transmitters and the first receivers may have the same interface types, the asymmetric structure of the CTRL I/F CIRCUIT 110*a* or 110*b* may maintain communication between the CTRL I/F CIRCUITS 110*a* and 110*b* and the MEM I/F CIRCUITS 210*a* and 210*b* regardless of the interface type of the MEM I/F CIRCUIT 210*a* or 210*b*. Accordingly, when the memory device 200 such as that of FIG. 1 is initialized, the memory controller 100 such as that of FIG. 1 may omit an input/output interface type identification operation before the initialization of the memory device 200, and the memory device 200 need not necessarily power-off. In addition, occurrence of communication errors due to a mismatch between the input/output interfaces of the memory controller 100 and the memory device 200 may be suppressed.

Figure 4:
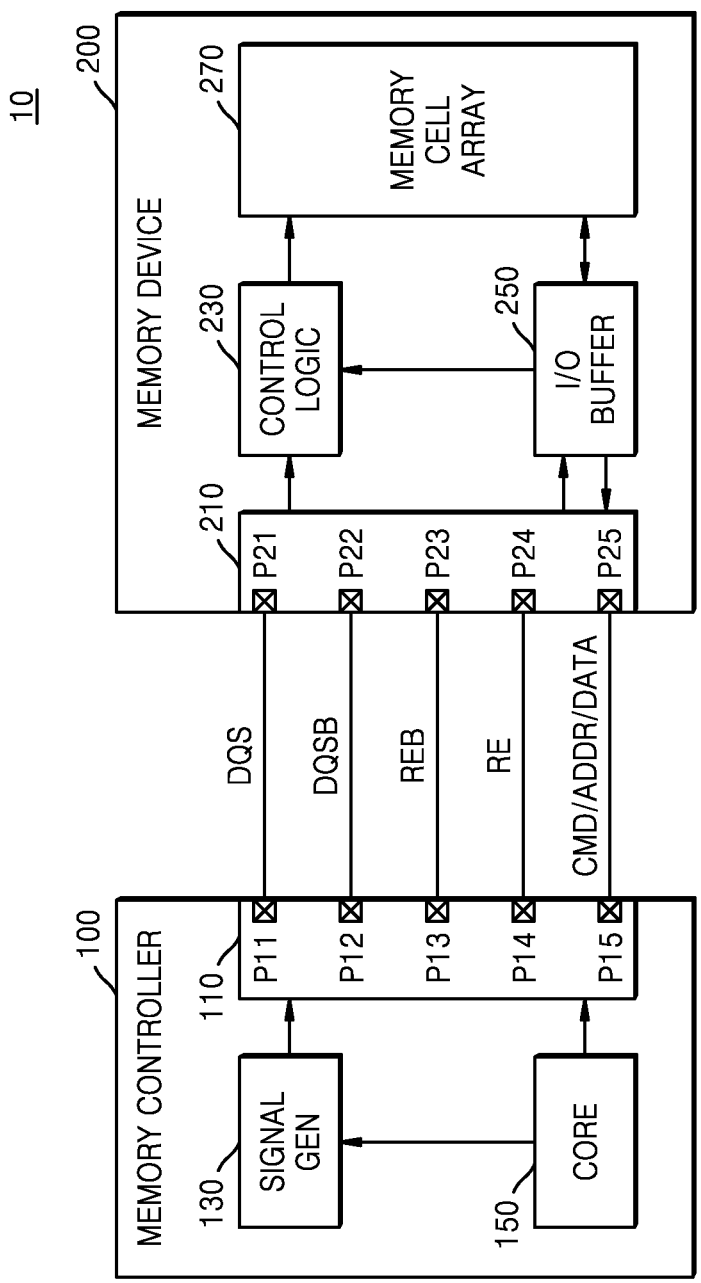
FIG. 4 is a block diagram of a storage device including an input/output pin according to an embodiment of the inventive concept.

FIG. 4 is a block diagram of a storage device 10 including input/output pins P11, P12, P13, P14, P15, P21, P22, P23, P24, and P25 according to an embodiment of the inventive concept.

Referring to FIG. 4, the memory controller 100 may include a CTRL I/F CIRCUIT 110, a signal generator or SIGNAL GEN 130, and a core 150, where the CTRL I/F CIRCUIT 110 further includes the plurality of pins P11, P12, P13, P14, and P15. The memory device 200 may include a MEM I/F CIRCUIT 210, control logic 230, an input/output buffer 250, and a memory cell array 270, where the MEM I/F CIRCUIT 210 further includes the plurality of pins P21, P22, P23, P24, and P25.

According to an embodiment, the CTRL I/F CIRCUIT 110 may include a data strobe signal DQS pin P11, an inverse data strobe signal DQSB pin P12, an inverse read enable signal REB pin P13, a read enable signal RE pin P14, and a command/address and data input/output CMD/ADDR/DATA pin P15.

Correspondingly, the MEM I/F CIRCUIT 210 may include a data strobe signal DQS pin P21, an inverse data strobe signal DQSB pin P22, an inverse read enable signal REB pin P23, a read enable signal RE pin P24, and a command/address and data input/output CMD/ADDR/DATA pin P25.

The data strobe signal DQS pin P11 may correspond to the data strobe signal DQS pin P21, and the inverse data strobe signal DQSB pin P12 may correspond to the inverse data strobe signal DQSB pin P22. In an embodiment, the data strobe signal DQS may be transmitted from the data strobe signal DQS pin P11 to the data strobe signal pin P21, and may be toggled into a frequency corresponding to a data input/output rate. In an embodiment, the data strobe signal DQS may be toggled in a transmission section of a command CMD or address ADDR, or in a transmission and reception section of data DATA.

Similarly, the inverse read enable signal REB pin P13 may correspond to the inverse read enable signal REB pin P23, and the read enable signal RE pin P14 may correspond to the read enable signal RE pin P24. The read enable signal RE may be used for controlling read operations on the data stored in the memory device 200.

The memory controller 110 may transmit the command CMD and address ADDR to the memory device 200 through the command/address and data input/output CMD/ADDR/DATA pin P15. Accordingly, in an embodiment, the memory controller 100 may transmit the command CMD and the address ADDR to the memory device 200 during the transmission of the data DATA. However, embodiments are not limited thereto, and the pin through which the command CMD and the address ADDR are transmitted may be separated from the pin through which the data DATA is transmitted.

The memory controller 100 may synchronize the command CMD, the address ADDR, and the data DATA with the data strobe signal DQS, and may transmit the command CMD, the address ADDR, and the data DATA, which are synchronized with the data strobe signal DQS, to the memory device 200. In an embodiment, the command CMD, the address ADDR, and the data DATA may be synchronized with a rising edge of the data strobe signal DQS. In an embodiment, the command CMD, the address ADDR, and the data DATA may be synchronized with a falling edge of the data strobe signal DQS. In an embodiment, the command CMD, the address ADDR, and the data DATA may be synchronized with the rising and falling edges of the data strobe signal DQS. In other words, the command CMD, the address ADDR, and the data DATA may be transmitted to the memory device 200 under a double data rate (DDR) mode. Accordingly, with an increase in the frequency of the data strobe signal DQS, the transmission rate of the data DATA as well as the transmission rate of the command CMD and address ADDR may be high. However, embodiments are not limited thereto, and it will be understood that the command CMD, the address ADDR, and the data DATA may be synchronized with the read enable signal RE and/or a write enable signal WE, for example.

The SIGNAL GEN 130 may generate control signals needed for operating the storage device 10. According to an embodiment, the SIGNAL GEN 130 may generate the data strobe signal DQS, the inverse data strobe signal DQSB, the read enable signal RE, the inverse read enable signal REB, and in addition, may also generate various signals such as a command latch enable signal CLE indicating a time point at which the command CMD is transmitted, an address latch enable signal ALE indicating a time point at which the address ADDR is transmitted, a clock signal CLK and the like to operate the storage device 10. Although pins for transmitting the command latch enable signal CLE and/or the address latch enable signal ALE are not shown, each may be further included in the CTRL I/F CIRCUIT 110, without limitation thereto. The memory controller 100 may distinguish the command CMD, the address ADDR, and the data DATA transmitted to the memory device 200 through a same channel, such as by using the command latch enable signal CLE and the address latch enable signal ALE, without limitation thereto.

The core 150 may perform operations needed for operating the storage device 10 and provide the command CMD commanding operations of the memory device 200. According to an embodiment, the core 150 may generate commands such as a read command and a write command related to the memory operations. Furthermore, various commands CMDs may be issued for operation of the storage device 10. The issued commands CMDs may be directly provided to the CTRL I/F CIRCUIT 110, without limitation thereto. Calculation results of the core 150 may be provided to the SIGNAL GEN 130 and used for generating the control signals, for example.

Control logic 230, such as but not limited to a control logic circuit, may receive the command CMD and address ADDR buffered to the input/output buffer 250, and may control memory operations on a plurality of memory cells included in the memory cell array 270 based on the received command CMD and address ADDR. For example, when the memory operation is a read operation, the data DATA read from the memory cell array 270 may be buffered in the input/output buffer 250. The input/output buffer 250 may transmit the buffered data DATA to the memory controller 100 through the MEM I/F CIRCUIT 210. In addition, when the memory operation is a write operation, the input/output buffer 250 may receive the data DATA, which is to be written into the memory cell array 270, from the memory controller 110 through the MEM I/F CIRCUIT 210.

The input/output buffer 250 may buffer the command CMD and address ADDR received through the input/output pin P25 and the data DATA read from the memory cell array 270. For example, the memory device 200 may buffer the command CMD in response to enabling of the command latch enable signal CLE. In addition, the memory device 200 may buffer the address ADDR in response to enabling of the address latch enable signal ALE.

Figure 5A:
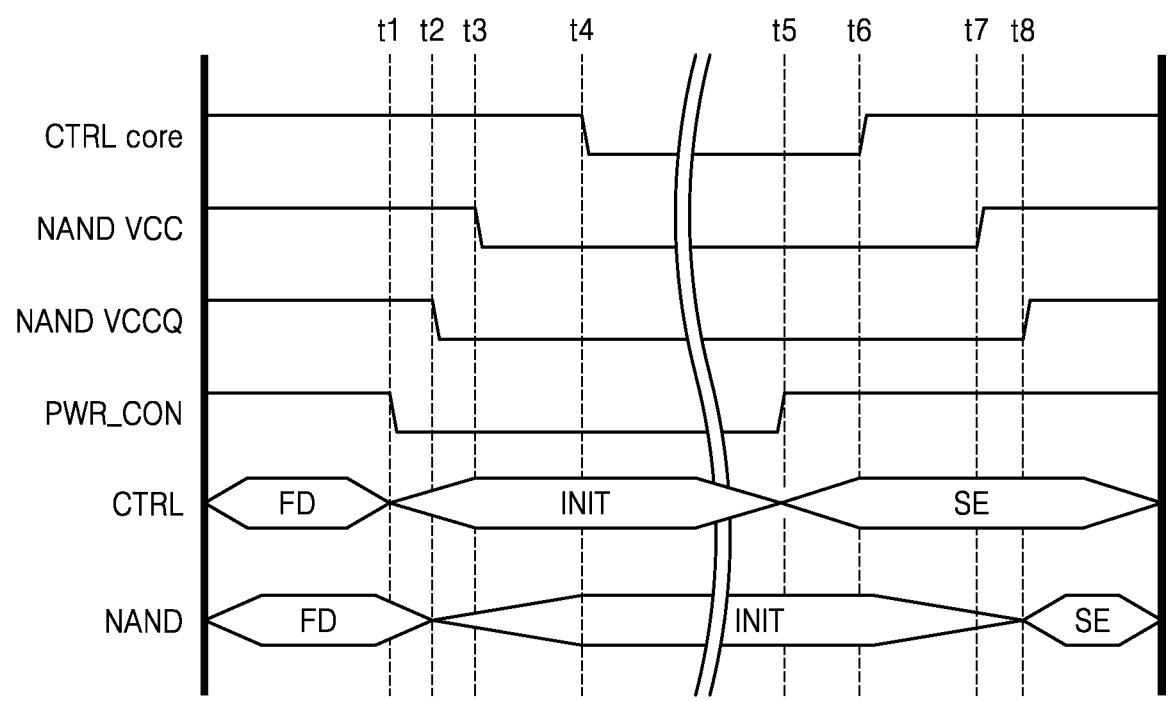
FIGS. 5A, 5B, and 5C are timing diagrams of changes in voltages and operation states of a memory controller and a memory device according to embodiments of the inventive concept.
Figure 5B:
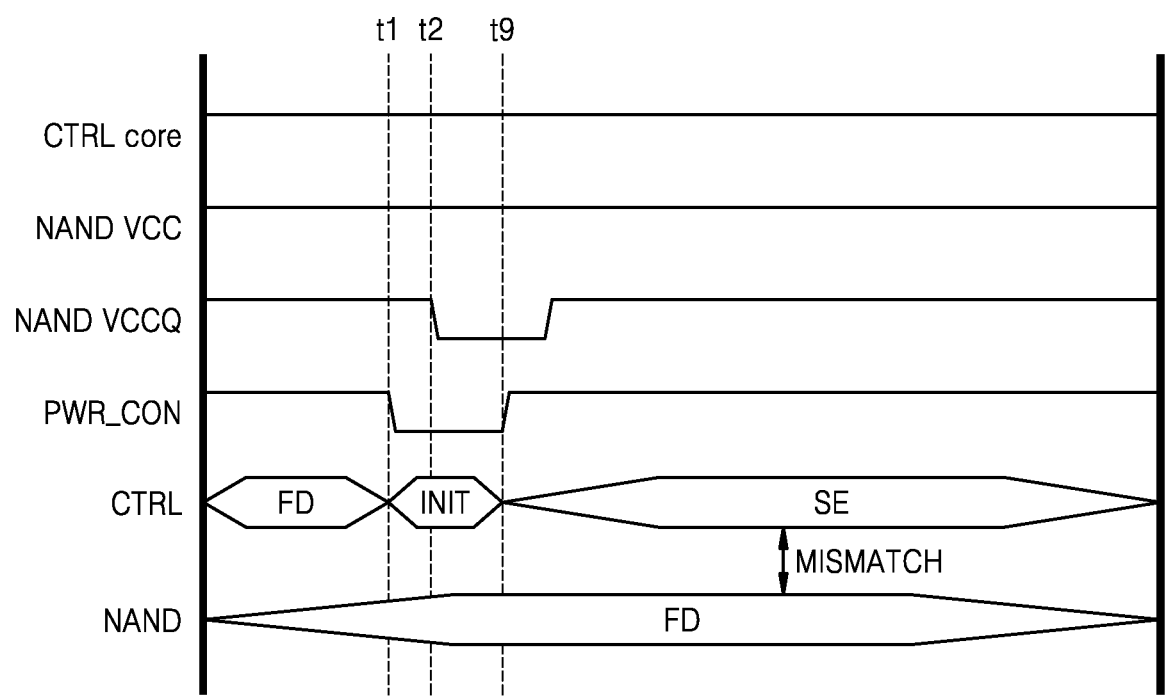
Figure 5C:
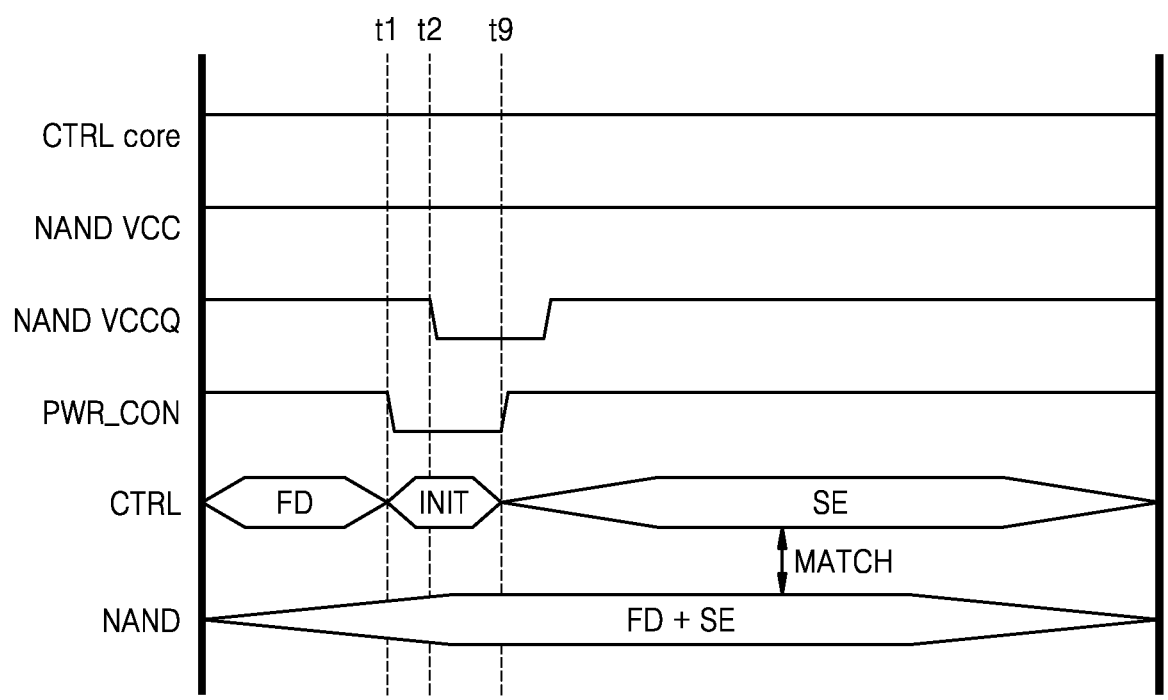

FIGS. 5A, 5B, and 5C show timing charts of changes in voltages and operation states of the memory controller 100 and the memory device 200 according to embodiments, in each of which a horizontal axis indicates a time period. FIG. 1 is re-referenced in conjunction with FIG. 2.

FIG. 5A shows a comparative example in which the transmitter 111 and receiver 113 included in the CTRL I/F CIRCUIT 110, according to an embodiment, are symmetrical, and a sufficient time period has passed after the storage device 10 entered the power management mode.

Before time point t1, the memory controller 100 and the memory device 200 may both be operated under the fully differential interconnection mode FD.

At the time point t1, the memory controller 100 may recognize the power management mode. The power management mode may be requested by a host or may be entered according to a preset protocol. Various states such as standby, pause, hibernation, and power-off may be provided in the power management mode. For convenience of explanation, without limitation thereto, it may be assumed that input/output of the data DATA is blocked but input/output of the command CMD is allowed in the power management mode.

Referring again to the time point t1, as the memory controller 100 recognizes the power management mode, the memory controller 100 may shift the state of the power control signal PWR_CON, which is one of the control signals, from the logic high level to the logic low level. The power control signal PWR_CON may be transmitted to the power management circuit of the memory device 200. As the memory controller 100 recognizes the power management mode, the memory controller 100 may be operated under an initialization mode INIT, and need not be operated under the fully differential interconnection mode FD.

At time point t2, as the memory device 200 enters the power management mode, the NAND power voltage input/output signal NAND_VCCQ may be shifted from the logic high level to the logic low level. As the NAND power voltage input/output signal NAND_VCCQ is shifted to the logic low level, the memory device 200 may operate under the initialization mode INIT, and need not be operated under the fully differential interconnection mode FD.

At time point t3, after the NAND power voltage input/output signal NAND_VCCQ is shifted, a NAND power voltage signal NAND_VCC may be shifted from the logic high level to the logic low level. For example, the NAND power voltage signal NAND_VCC may be shifted after 100 microseconds (μs) from a time point of entering the power management mode, but is not limited thereto.

At time point t4, a controller core signal CTRL_core may be shifted from the logic high level to the logic low level. For example, the controller core signal CTRL_core may be generated in the core 150. Accordingly, the core 150 may provide the command CMD and need not provide a signal controlling input and output of the data.

At time point t5 that is after a sufficient time period from the time point t4, the memory controller 100 may recognize an awake mode. The awake mode may be requested by a host or may be entered according to a preset protocol.

Referring again to the time point t5, according to the recognition of the awake mode, the memory controller 100 may shift a state of the power control signal PWR_CON from the logic low level to the logic high level. The power control signal PWR_CON may be transmitted to the power management circuit of the memory device 200. As the memory controller 100 recognizes the awake mode, the memory controller 100 may transition from the initialization mode IN_IT to the single-ended interconnection mode SE.

At time point t6, the controller core signal CTRL_core may be provided to the core 150 of the memory controller 100, and the controller core signal CTRL_core may be shifted from the logic low level to the logic high level. Accordingly, the core 150 may again provide a signal for exchanging the data DATA, in addition to the command CMD. In an embodiment, time point t6 may be after about 250 μs after being transitioned into the single-ended interconnection mode SE, but is not limited thereto.

At time point t7, the NAND power voltage signal NAND_VCC may be shifted from the logic low level to the logic high level. For example, the NAND power voltage signal NAND_VCC may be shifted after about 350 μs from the time point of entering the single-ended interconnection mode SE, but is not limited thereto.

At time point t8, the NAND power voltage input/output signal NAND_VCCQ may be shifted from the logic low level to the logic high level. For example, the NAND power voltage input/output signal NAND_VCCQ may be shifted after about 400 μs has elapsed from the time point of entering the single-ended interconnection mode SE, but is not limited thereto. At the time point t8, the memory device 200 may operate under the single-ended interconnection mode SE.

According to FIG. 5A, the storage device 10 is changed into the wakeup mode after a sufficient time period has elapsed after entering the power management mode, and therefore, the memory controller 100 and the memory device 200 may fluently communicate under the single-ended interconnection mode SE. A communication rate of the single-ended interconnection mode SE may be lower than that of the fully differential interconnection mode FD.

FIG. 5B shows a comparative example in which the transmitter 111 and receiver 113 included in the CTRL I/F CIRCUIT 110 are symmetrical according to an embodiment, and a sufficient time period passed after the storage device 10 entered the power management mode.

Before the time point t1, the memory controller 100 and the memory device 200 may both operate under the fully differential interconnection mode FD.

At the time point t1, the memory controller 100 may recognize the power management mode. The power management mode may be requested by a host or may be entered according to a preset protocol, such as an internal memory controller protocol without limitation thereto. As the memory controller 100 recognizes the power management mode, the memory controller 100 may shift the state of the power control signal PWR_CON, that is one of the control signals, from the logic high level to the logic low level. As the memory controller 100 recognizes the power management mode, the memory controller 100 may be operated under an initialization mode INIT, and need not be operated under the fully differential interconnection mode FD.

At the time point t2, as the memory device 200 enters the power management mode, the NAND power voltage input/output signal NAND_VCCQ may be shifted from the logic high level to the logic low level. As the NAND power voltage input/output signal NAND_VCCQ is shifted to the logic low level, the memory device 200 may operate under the initialization mode INIT, and need not operate under the fully differential interconnection mode FD.

At time point t9, before a sufficient time period passes after entering the power management mode, as the memory controller 100 recognizes the awake mode, the memory controller 100 may shift the state of the power control signal PWR_CON from the logic low level to the logic high level. In an embodiment, the time point t9 may be after about 10 μs from the time point t1. As the memory controller 100 recognizes the awake mode, the memory controller 100 may operate in a state of being changed into the single-ended interconnection mode SE from the initialization mode INIT. Similarly, after a preset time period, the NAND power voltage input/output signal NAND_VCCQ may be shifted into the logic high level.

According to FIG. 5B, the storage device 10 is changed into the wakeup mode before a sufficient time period passes after entering the power management mode. In an embodiment, although the memory controller 100 is changed into the single-ended interconnection mode SE after the initialization mode INIT, the NAND power voltage signal NAND_VCC is not shifted, and therefore, the mode of the memory device 200 may still be the fully differential interconnection mode FD. That is, interfacing methods of the memory controller 100 and the memory device 200 mismatch.

Consequently, the memory controller 100 is in the single-ended interconnection mode SE, while the memory device 200 is in the fully differential interconnection mode FD. In other words, compared to where the memory controller 100 transmits the control signal through one transmission line, the memory device 200 receives the control signals through one transmission line but transmits the control signals through two transmission lines; therefore, there is possibility of miscommunication in the communication between the memory controller 100 and the memory device 200.

FIG. 5C shows a comparative example in which the transmitter 111 and the receiver 113 included in the CTRL I/F CIRCUIT 110 are asymmetrical to each other according to an embodiment.

Operation of the storage device 10 before the time point t9 is similar to that of FIG. 5B, so duplicate description may be omitted. However, there is a difference in that the memory controller 100 may support both the fully differential interconnection mode and the single-ended interconnection mode.

At the time point t9 (after about 10 μs from t1), as the memory controller 100 recognizes the AWAKE mode, the memory controller 100 may shift the state of the power control signal PWR_CON from the logic low level to the logic high level, and once the memory controller 100 recognizes the AWAKE mode, the memory controller 100 may operate in a state of being changed from the initialization mode INIT to the single-ended interconnection mode SE.

According to FIG. 5C, the storage device 10 is changed into the wakeup mode before a sufficient time period passes after entering the power management mode. In an embodiment, although the memory controller 100 is changed into the single-ended interconnection mode SE after the initialization mode IN_IT, the NAND power voltage signal NAND_VCC is not shifted, and therefore, like in the FIG. 5B, the mode of the memory device (NAND) 200 is still the fully differential interconnection mode FD.

However, the transmitter 111 and receiver 113 included in the memory controller 100 may have an asymmetrical structure, and accordingly, the transmitter 111 may be in the fully differential interconnection mode FD, while the receiver 113 is in the single-ended interconnection mode SE. Therefore, even when the mode of the memory device 200 is the single-ended interconnection mode SE, the memory controller 100 matches the mode of the memory device 200 with the interfacing method of the memory controller 100.

Consequently, the memory controller 100 may support both of the single-ended interconnection mode SE and the fully differential interconnection mode FD, and even when the memory device 200 is in any one of the single-ended interconnection mode SE and/or the fully differential interconnection mode FD, the memory device 200 may suppress miscommunications in communication between the memory controller 110 and the memory device 200.

Figure 6:
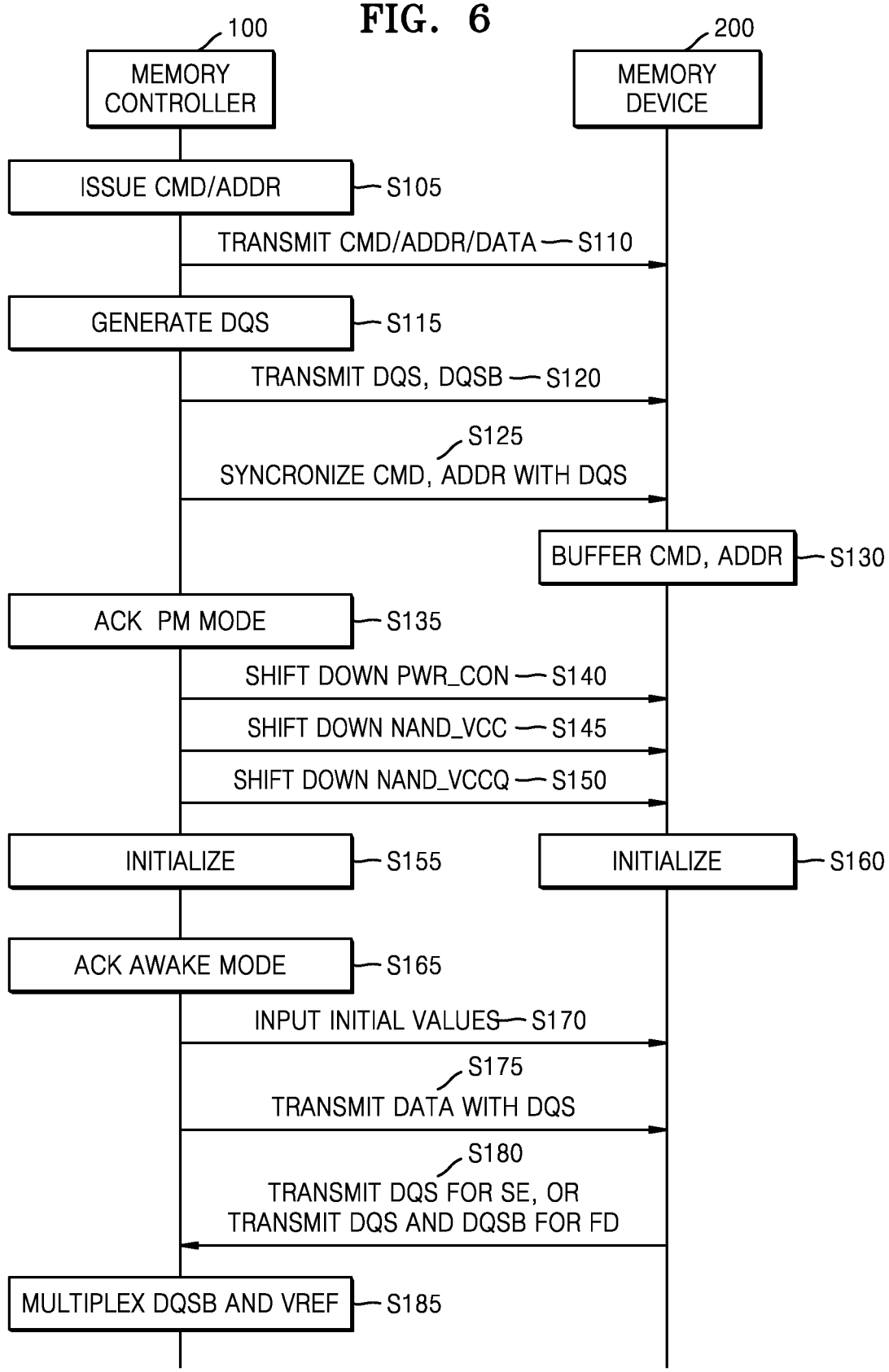
FIG. 6 is a flowchart diagram of operations of a memory controller and a memory device according to an embodiment of the inventive concept.

FIG. 6 is a flowchart of operations of the memory controller 100 and the memory device 200 according to an embodiment of the inventive concept. FIGS. 1 and 3 are referenced in conjunction with FIG. 6.

In function block S105, the memory controller 100 may issue the command CMD and the address ADDR.

In function block S110, the memory controller 100 may provide the command CMD and the address ADDR to the memory device 200. For example, the input/output buffer 250 of the memory device 200 may buffer the command CMD and the address ADDR.

In function block S115, the SIGNAL GEN 130 of the memory controller 100 may generate the data strobe signal DQS.

In function block S120, the memory controller 100 may provide the data strobe signal DQS and the inverse data strobe signal DQSB to the memory device 200.

In function block S125, the command CMD and address ADDR may be synchronized by the data strobe signal DQS.

In function block S130, the input/output buffer 250 of the memory device 200 may buffer the command CMD and address ADDR.

In function block S135, the memory controller 100 may recognize or acknowledge the power management mode (PM MODE).

In function block S140, the memory controller 100 may shift down a logic level of the power control signal PWR_CON, which is transmitted to the power management circuit of the memory device 200, from logic high to logic low.

In function block S145, the memory controller 100 may shift down a logic level of the NAND power voltage signal NAND_VCC, which is transmitted to the memory device 200, from logic high to logic low.

In function block S150, the memory controller 100 may shift down a logic level of the NAND power voltage input/output signal NAND_VCCQ, which is transmitted to the memory device 200, from logic high to logic low.

In function block S155, the memory controller 100 may be initialized. In an embodiment, the initialization mode of the memory controller 100 may be after shifting the logic level of the NAND power voltage input/output signal NAND_VCCQ. However, the initialization mode of the memory controller 100 is not limited thereto and may be understood as being after the level of power control signal PWR_CON is shifted.

In function block S160, the memory device 200 may be initialized.

In function block S165, the memory controller 100 may recognize or acknowledge the awake mode.

In function block S170, the memory controller 100 may input initial values for the initialization of the memory device 200.

In function block S175, the memory controller 100 may transmit the data strobe signal DQS, which synchronizes the data DATA, to the memory device 200.

In function block S180, according to the interface mode of the memory device 200, the memory device 200 may provide the data strobe signal DQS or provide the data strobe signal DQS and the inverse data strobe signal DQSB to the memory controller 100. For example, when the interface mode is the fully differential interconnection mode FD, the memory device 200 may provide the data strobe signal DQS and the inverse data strobe signal DQSB to the memory controller 100; and when the interface mode is the single-ended interconnection mode SE, the memory device 200 may provide the data strobe signal DQS to the memory controller 100.

In function block S185, the receiver 113 of the memory controller 100 may receive a signal in response to output of the multiplexer 114 configured to multiplex the reference voltage signal Vref or the inverse data strobe signal DQSB to the receiver 113.

Figure 7:
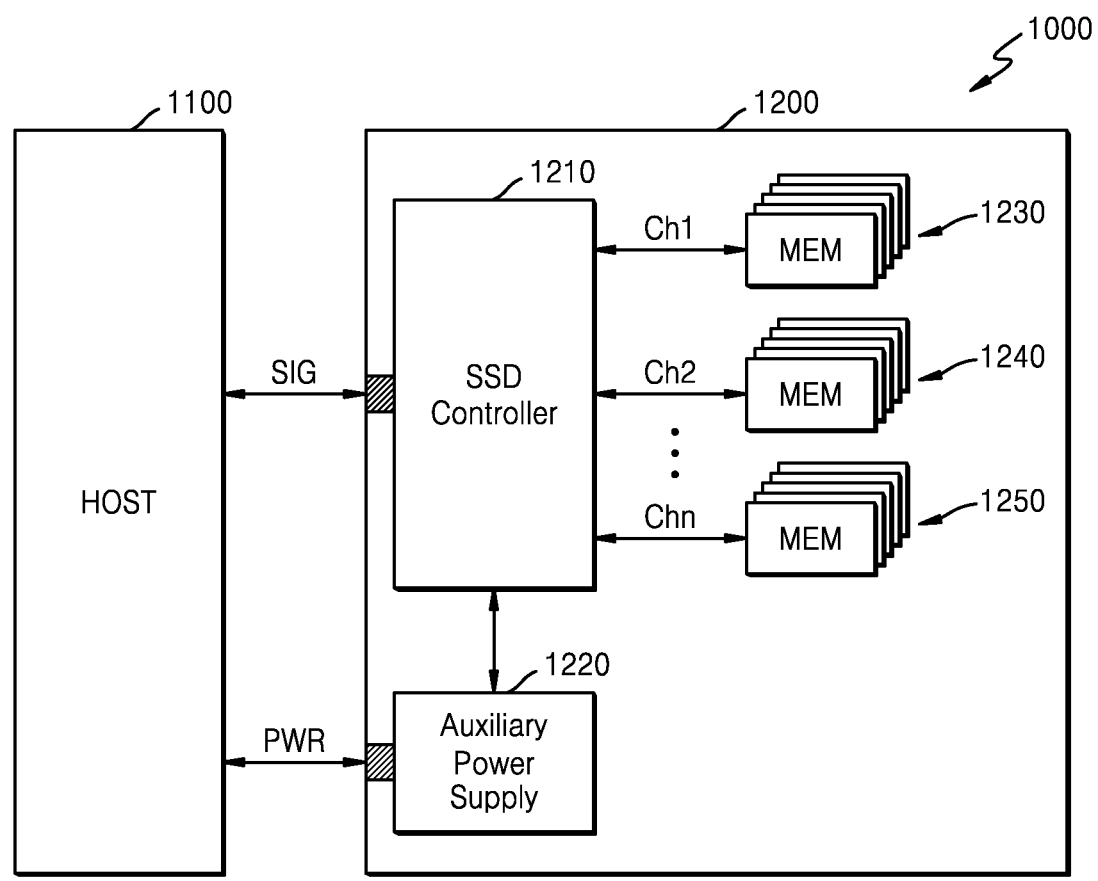
FIG. 7 is a block diagram of a storage system according to an embodiment of the inventive concept.

FIG. 7 is a block diagram of a storage system 1000 according to an embodiment of the inventive concept.

Referring to FIG. 7, the storage system 1000 may include a host 1100 and a Solid-State Drive (SSD) 1200. The SSD exchanges signals SIG with the host 1100 through a signal connector and receives power PWR through a power connector. The SSD 1200 may include an SSD controller 1210, an auxiliary power device 1220, and memory devices 1230, 1240, and 1250. The memory devices 1230, 1240, and 1250 may be respectively connected to the SSD controller 1210 through channels Ch1, Ch2, and Chn.

The SSD controller 1210 may be embodied by using the memory controller 100 described in detail with reference to FIGS. 1 through 6. In detail, the SSD controller 1210 may output the command CMD and address ADDR through a same input/output channel as that of the data, and may synchronize the command and address to a clock signal CLK such as the data strobe signal DQS and transmit the command and address to the memory devices 1230, 1240, and 1250.

The memory devices 1230, 1240, and 1250 may be embodied by using the memory device 200 described in detail with reference to FIGS. 1 through 6. In detail, each of the memory devices 1230, 1240, and 1250 may receive the command and address from the SSD controller through an input/output channel that is the same channel as the data, and may receive, from the SSD controller 1210, the command and address in synchronization with a clock signal such as a data input/output clock signal.

As an embodiment, the storage system 1000 may constitute a storage of a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a portable multimedia player (PMP), a handheld game console, a navigation device, a black box, a digital camera, a Digital Multimedia Broadcasting (DMB) player, a three-dimensional television, a smart television, a digital audio recorder, a digital audio player, a digital picture recorder, a digital picture player, a digital recorder, a digital video player, a data center server, a device capable of transmitting and receiving data in a wireless environment, one of various electronic devices constituting a home network, one of various electronic devices constituting a computer network, one of various electronic devices constituting a telematics network, a radio frequency identification (RFID) device, one of various components constituting a computing system, or the like.

The storage system 1000 according to an embodiment may be mounted by using various types of packages. For example, the storage system 1000 may be mounted in the form of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi-Chip Package, and the like.

While the inventive concept has been particularly shown and described with reference to embodiments thereof, it will be understood by those of ordinary skill in the pertinent art that various changes in form and details may be made therein without departing from the scope and spirit of the inventive concept as set forth in the following claims.

What is claimed is:

1. A memory controller configured to control a non-volatile memory device, the memory controller comprising:
   a signal generator configured to generate a plurality of control signals comprising a first control signal and a second control signal;
   a core configured to provide a command for an operation of the memory device; and
   a controller interface circuit configured to interface with the memory device,
   wherein the controller interface circuit comprises a first transmitter connected to a first signal line and a second signal line, and a first receiver connected to the first signal line,
   wherein the first control signal and the second control signal are respectively transmitted to the memory device through the first signal line and the second signal line,
   wherein the first transmitter is configured to apply a differential interconnection method,
   wherein the first receiver is configured to apply a single-ended interconnection method.

2. The memory controller of claim 1, wherein:
   the first control signal is a data strobe signal, the second control signal is an inverse data strobe signal, the data strobe signal synchronizes input of the data and output of the data, and the inverse data strobe signal is a phase inversion signal of the data strobe signal.

3. The memory controller of claim 1, wherein:

the first transmitter is configured to apply a single fully differential interconnection method.

4. The memory controller of claim 1, wherein:

the plurality of control signals further comprise a third control signal and a fourth control signal, and the controller interface circuit further comprises a second transmitter configured to transmit the third control signal and the fourth control signal.

5. The memory controller of claim 4, wherein:

the third control signal is a read enable signal, the fourth control signal is an inverse read enable signal, the read enable signal is toggled to continuously read data from the non-volatile memory device, and the inverse read enable signal is a phase inversion signal of the read enable signal.

6. The memory controller of claim 1, wherein the controller interface circuit further comprises:

a first pin through which a data strobe signal synchronizing input data and output data is transmitted;

a second pin through which the data strobe signal is inverted and transmitted;

a third pin through which a read enable signal toggled for reading data is transmitted;

a fourth pin through which the read enable signal is inverted and transmitted; and a fifth pin through which the command, address, and data are transmitted.

7. The memory controller of claim 1, wherein the controller interface circuit further comprises a multiplexer connected to the first receiver.

8. The memory controller of claim 7, wherein:

the first receiver receives a fifth control signal for data synchronization after the first control signal is transmitted through the first signal line, and the multiplexer multiplexes a sixth control signal for data synchronization with a reference voltage signal after the second control signal is transmitted through the second signal line.

9. A storage device comprising:

a non-volatile memory device; and a memory controller configured to control the non-volatile memory device by providing to the non-volatile memory device a command, an address, data, and a control signal, wherein the memory controller comprises a controller interface comprising a first transmitter configured to apply a differential interconnection method, a first receiver configured to apply a single-ended interconnection method, and a controller interface circuit configured to interface with the non-volatile memory device, and wherein the non-volatile memory device comprises a memory interface circuit comprising a second transmitter and a second receiver, the memory interface circuit configured to interface with the memory controller.

10. The storage device of claim 9, wherein the controller interface circuit further comprises:

a first pin through which a data strobe signal synchronizing data input/output is transmitted;

a second pin through which the data strobe signal is inverted and transmitted;

a third pin through which a read enable signal toggled for reading data is transmitted;

a fourth pin through which the read enable signal is inverted and transmitted; and a fifth pin through which the command, address, and data are transmitted.

11. The storage device of claim 10, wherein the memory interface circuit further comprises:

a sixth pin corresponding to the first pin;

a seventh pin corresponding to the second pin;

an eighth pin corresponding to the third pin;

a ninth pin corresponding to the fourth pin; and a tenth pin corresponding to the fifth pin.

12. The storage device of claim 11, wherein:

the first receiver and the first transmitter receive and transmit the data strobe signal through the first pin, and the second receiver and the second transmitter receive and transmit the data strobe signal through the sixth pin.

13. The storage device of claim 9, wherein:

the controller interface circuit further comprises a multiplexer connected to the first receiver, the first receiver receives a data strobe signal from the memory interface circuit, the multiplexer multiplexes an inverse data strobe signal, which is received from the memory interface circuit, with a reference voltage signal, the data strobe signal synchronizes data input and data output, and the inverse data strobe signal is a phase inversion signal of the data strobe signal.

14. The storage device of claim 9, wherein:

the controller interface circuit further comprises a third transmitter configured to apply a fully differential interconnection method, and the memory interface circuit further comprises a third receiver that is configured to apply the single-ended differential interconnection method.

15. The storage device of claim 9, wherein the second transmitter and the second receiver are configured to apply the single-ended differential interconnection method.

16. The storage device of claim 9, wherein the second transmitter and the second receiver are configured to apply the fully differential interconnection method.

17. A memory system comprising:

a first interface circuit comprising a first transmitter connected to a first signal line and a second signal line and a first receiver connected to the first signal line; and a second interface circuit comprising a second receiver connected to at least one of the first signal line and the second signal line and a second transmitter connected to at least one of the first signal line and the second signal line, wherein a first control signal and a second control signal are respectively transmitted to the second interface circuit through the first signal line and the second signal line, and the first receiver receives a third control signal for data synchronization after the first control signal is transmitted through the first signal line.

18. The memory system of claim 17, wherein:

the first interface circuit further comprises a multiplexer connected to the first receiver and configured to multiplex a fourth control signal for data synchronization with a reference voltage signal after the second control signal is transmitted through the second signal line, the first control signal and the third control signal are data strobe signals synchronizing data input and data output, and the second control signal and the fourth control signal are inverse data strobe signals obtained by inverting a phase of the data strobe signal.

19. The memory system of claim 17, wherein:

the first transmitter is configured to apply a fully differential interconnection method, and the first receiver is configured to apply a single-ended interconnection method.

20. The memory system of claim 17, wherein:

the first interface circuit is included in a memory controller configured to control a volatile memory device, and the second interface circuit is included in the volatile memory device.

* * * * *